(12) United States Patent
Shinohara et al.

(10) Patent No.: US 10,249,711 B2
(45) Date of Patent: Apr. 2, 2019

(54) FET WITH MICRO-SCALE DEVICE ARRAY

(71) Applicant: Teledyne Scientific & Imaging, LLC, Thousand Oaks, CA (US)

(72) Inventors: Keisuke Shinohara, Thousand Oaks, CA (US); Miguel Urteaga, Moorpark, CA (US); Casey King, Ventura, CA (US); Avijit Bhunia, Newbury Park, CA (US); Ya-Chi Chen, Simi Valley, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 0 days.

(21) Appl. No.: 15/638,041

(22) Filed: Jun. 29, 2017

(65) Prior Publication Data

US 2019/0006464 A1 Jan. 3, 2019

(51) Int. Cl.
*H01L 29/15* (2006.01)
*H01L 29/66* (2006.01)
*H01L 27/088* (2006.01)
*H01L 21/337* (2006.01)
*H01L 29/06* (2006.01)
*H01L 29/778* (2006.01)
*H01L 29/20* (2006.01)
*H01L 29/423* (2006.01)
(Continued)

(52) U.S. Cl.
CPC ........ *H01L 29/0696* (2013.01); *H01L 23/522* (2013.01); *H01L 29/20* (2013.01); *H01L 29/2003* (2013.01); *H01L 29/41758* (2013.01); *H01L 29/4236* (2013.01); *H01L 29/4238* (2013.01); *H01L 29/778* (2013.01)

(58) Field of Classification Search
CPC ........... H01L 29/41758; H01L 29/4238; H01L 29/0696; H01L 29/0692; H01L 29/778; H01L 29/20; H01L 29/2003; H01L 29/4236; H01L 23/522; H01L 23/5226
USPC ......... 257/401, 341, 343, 758, 183, 76, 192; 438/191
See application file for complete search history.

(56) References Cited

U.S. PATENT DOCUMENTS 5,192,989 A * 3/1993 Matsushita ......... H01L 29/7801
257/338
5,936,271 A 8/1999 Alsmeier et al.
(Continued)

*Primary Examiner* — Fernando L Toledo
*Assistant Examiner* — Aaron J Gray
(74) *Attorney, Agent, or Firm* — M. J. Ram and Associates

(57) ABSTRACT

A FET employing a micro-scale device array structure comprises a substrate on which an epitaxial active channel area has been grown, with a plurality of micro-cells uniformly distributed over the active channel area. Each micro-cell comprises a source electrode, a drain electrode, and at least one gate electrode, with a first metal layer interconnecting either the drain or the source electrodes, a second metal layer interconnecting the gate electrodes, and a third metal layer interconnecting the other of the drain or source electrodes. Each micro-cell preferably comprises a source or drain electrode at the center of the micro-cell, with the corresponding drain or source electrode surrounding the center electrode. The number and width of the gate electrodes in each micro-cell may be selected to achieve a desired power density and/or heat distribution, and/or to minimize the FET's junction temperature. The FET structure may be used to form, for example, HEMTs or MESFETs.

26 Claims, 3 Drawing Sheets

(51) Int. Cl.
    *H01L 29/417*     (2006.01)
    *H01L 23/522*     (2006.01)

(56) References Cited

U.S. PATENT DOCUMENTS

| | | |
|---|---|---|
| 5,966,520 A | 10/1999 | Buer et al. |
| 6,492,205 B1 | 12/2002 | Liu et al. |
| 6,503,774 B2 | 1/2003 | Tsai et al. |
| 7,961,052 B2 | 6/2011 | Bacon |
| 8,536,931 B2 | 9/2013 | Kobayashi |
| 8,541,271 B1 | 9/2013 | Vorhaus |
| 2005/0161706 A1* | 7/2005 | Sutardja .............. H01L 23/4824 257/211 |
| 2008/0277697 A1* | 11/2008 | Kobayashi .......... H01L 23/4821 257/276 |
| 2010/0025730 A1* | 2/2010 | Heikman .............. H01L 29/402 257/194 |
| 2017/0316932 A1* | 11/2017 | Ohlsson .............. H01L 21/0237 |

* cited by examiner

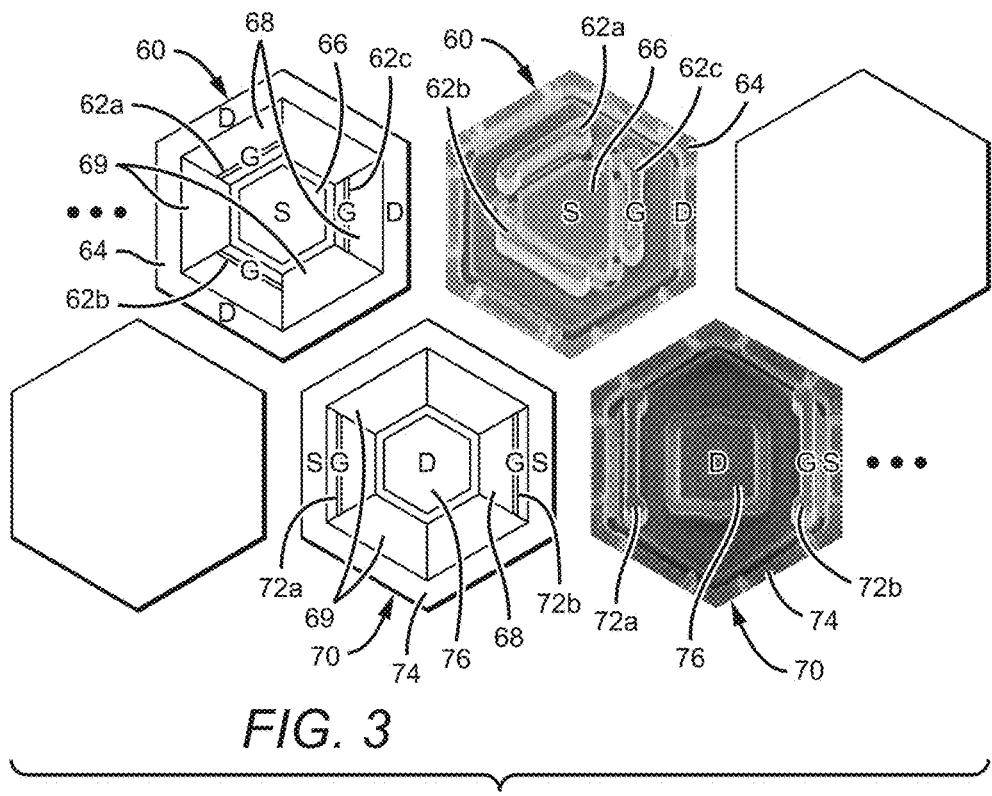
FIG. 3
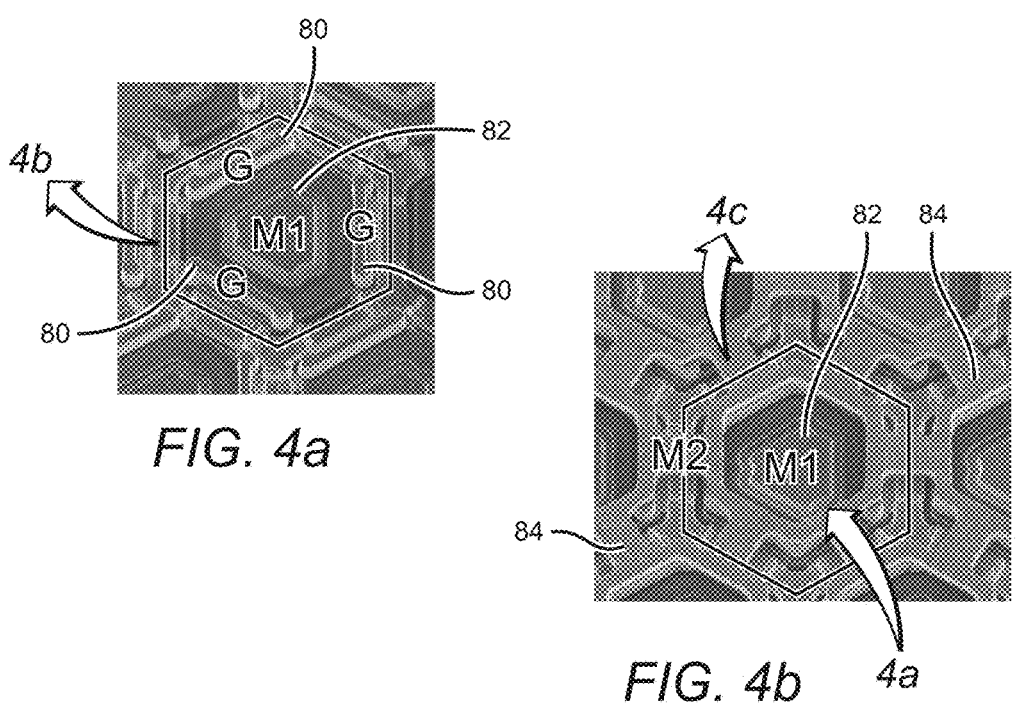
FIG. 4a
FIG. 4b

US 10,249,711 B2

FET WITH MICRO-SCALE DEVICE ARRAY

BACKGROUND OF THE INVENTION

Field of the Invention

This invention relates generally to field-effect transistors (FETs), and more particularly to a FET employing a micro-scale device array structure which enables uniform distribution of heat generated under high power operation.

Description of the Related Art

In conventional FETs with long parallel gate fingers, "self-heating" that occurs under high power operation increases the device's channel temperature. The increased channel temperature limits the power performance (gain, output power, efficiency, linearity) of FET's used as power amplifiers and shortens their lifetime.

For such FETs, the junction temperature (Tj) peaks at the drain end of the gate, where the electric field is the highest. The Tj increases with gate width due to increased thermal resistance. To reduce Tj, gate-to-gate pitch can be increased to reduce thermal cross-talk between adjacent gates in the multi-finger devices. However, this approach increases device unit cell size and reduces area power density. But unit cell size is limited by both gate resistance and phase-delay at a given frequency. Therefore, maximum available output power from a unit device cell is limited by the maximum Tj and the maximum unit cell size. To achieve a desired power level from power amplifiers, multiple cells are combined using power combining circuits, which increases chip size and adds loss, especially at high frequencies.

SUMMARY OF THE INVENTION

A FET employing a micro-scale device array structure is presented, which enables uniform distribution of heat generated under high power operation.

The present FET comprises a substrate on which an epitaxial active channel area has been grown, with a plurality of micro-cells uniformly distributed over the active channel area. Each micro-cell comprises a source electrode, a drain electrode, and at least one gate electrode. The FET further comprises a multi-layer interconnection arrangement, with a first metal layer interconnecting either the drain or the source electrodes, a second metal layer interconnecting the gate electrodes, and a third metal layer interconnecting the other of the drain or source electrodes. The second and third metal layers preferably comprise air-bridge interconnection layers.

The metal layer interconnecting the gate electrodes is preferably a substantially continuous sheet of metal, except for via openings which enable connection to the source and/or drain electrodes below the gate metal. Each micro-cell preferably comprises a source or drain electrode at the center of the micro-cell, with the corresponding drain or source electrode surrounding the center electrode.

Each micro-cell has x sides, and the at least one gate electrode can consist of 1 to x gate electrodes. For example, in an embodiment with a GaN substrate having a hexagonal epitaxial crystal, the micro-cell's center electrode, and its perimeter, may be hexagonal, with the gate electrodes aligned parallel to the m-planes of the hexagonal epitaxial crystal. The number and width of gate electrodes in each micro-cell may be selected to achieve a desired power density (W/mm) and/or heat distribution, and/or to minimize the FET's junction temperature. A plurality of micro-cells may be interconnected to form a unit cell for a power amplifier.

The present FET may also include a channel layer on the substrate, with each of the gate electrodes comprising a buried gate structure, the top of which extends above the substrate's top surface and the bottom of which is buried to a depth at least equal to that of the bottom of the channel layer, such that the buried gate structures contact the channel layer only from its sides. Each buried gate structure preferably has a head portion above and not in contact with the substrate's top surface, with the second metal layer contacting and interconnecting the tops of the head portions. The present FET structure may be used to form, for example, HEMTs or MESFETs.

These and other features, aspects, and advantages of the present invention will become better understood with reference to the following drawings, description, and claims.

BRIEF DESCRIPTION OF THE DRAWINGS

FIG. 3 depicts plan views and overhead photographs illustrating micro-cells having three gate electrodes, and having two gate electrodes.

FIG. 4a is an overhead photograph depicting a micro-cell without a gate electrode-interconnecting metal layer.

FIG. 4b is an overhead photograph depicting a micro-cell with a gate electrode-interconnecting metal layer.

DETAILED DESCRIPTION OF THE INVENTION

Figure 1:
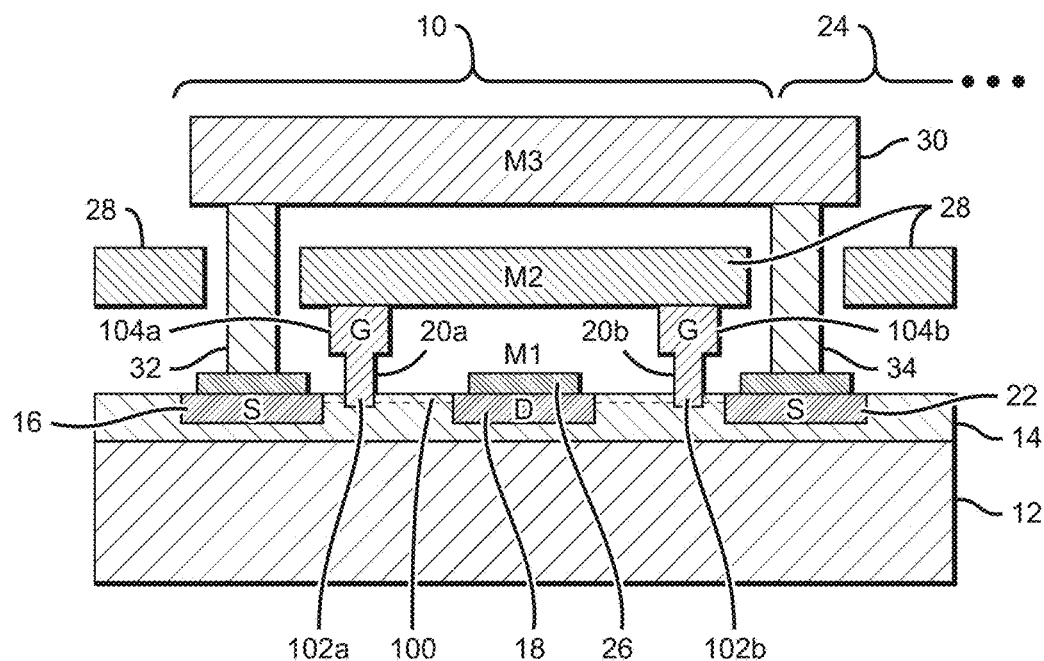
FIG. 1 is sectional view of a micro-cell as might form part of a FET per the present invention.

The present FET employs a micro-scale device array structure, which enables uniform distribution of heat, which is especially beneficial under high power operation. The FET comprises a plurality of interconnected micro-cells. A sectional view of one possible embodiment of a micro-cell in accordance with the invention is shown in FIG. 1. The micro-cell 10 is formed on a substrate 12 on which an epitaxial active channel area 14 has been grown; in practice, a plurality of such micro-cells are uniformly distributed over the active channel area. Each micro-cell comprises a source electrode 16, a drain electrode 18, and at least one gate electrode. Two gate electrodes 20a and 20b are shown in the exemplary embodiment of FIG. 1, which also depicts a source electrode 22 for an adjacent micro-cell 24.

The micro-cells also comprises a multi-layer interconnection arrangement, wherein a first metal layer 26 (labeled M1) interconnects either the drain or source electrodes (the drain electrodes in the embodiment of FIG. 1), a second metal layer 28 (labeled M2) interconnects the gate electrodes 20a and 20b, and a third metal layer 30 (labeled M3) interconnects the other of the drain or source electrodes (here, the source electrodes 16 and 22).

The second and third metal layers (28, 30) preferably comprise air-bridge interconnection layers. The micro-cell would typically employ vias 32, 34 to provide conductive paths between third metal layer 30 and the drain or source electrodes. The micro-cell would typically also include dielectric layers (not shown) between the first and second metal layers and between the second and third metal layers. Suitable materials for the dielectric layers include BCB, $SiO_2$, SiN, or SiCN.

Figure 2:
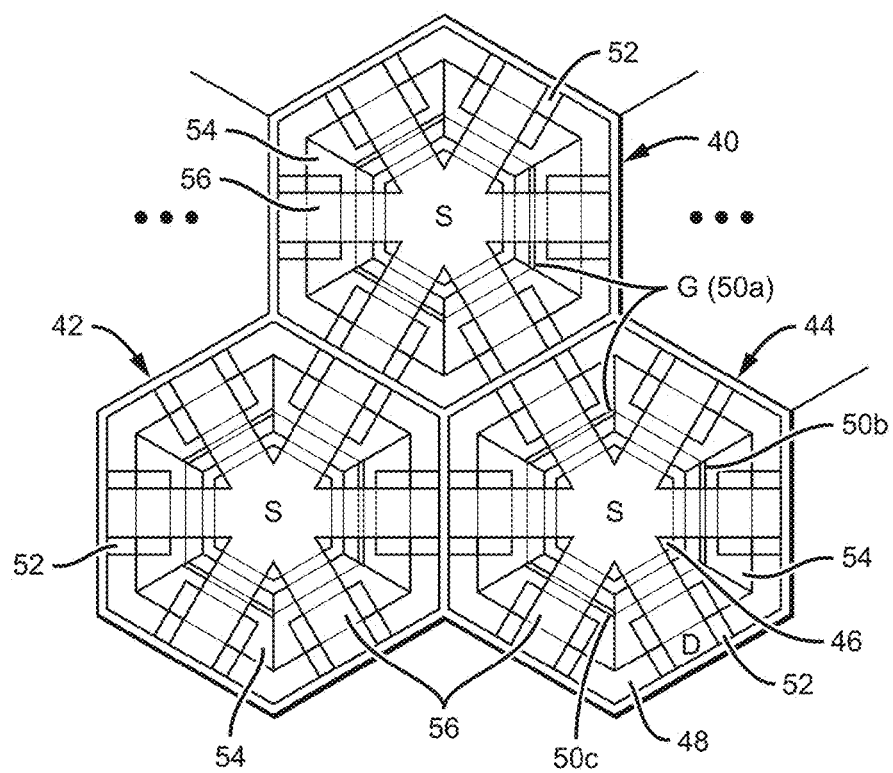
FIG. 2 is plan view of three micro-cells per the present invention.

A plan view of three micro-cells 40, 42, 44 in accordance with the present invention is shown in FIG. 2; in practice, many other micro-cells would be similarly arrayed. Using micro-cell 44 as an example, each micro-cell includes a source electrode 46, a drain electrode 48, and at least one gate electrode; there are three gate electrodes 50a, 50b, and 50c in micro-cell 44. In this example, a first metal layer 52 is used to interconnect the drain electrodes in each micro-cell, second metal layer 54 interconnects the gate electrodes, and third metal layer 56 interconnects the source electrodes.

In a preferred embodiment, one of the source or drain electrodes is located at the center of the micro-cell, and the other of the source or drain electrodes surrounds the center electrode. For example, in the exemplary embodiment shown in FIG. 2, source electrode 46 is at the center of micro-cell 44, and drain electrode 48 surrounds the source electrode.

The micro-cells preferably all have the same shape around their outer perimeter. In general, each micro-cell has x sides, with the at least one gate electrode consisting of 1 to x gate electrodes. For example, in FIG. 2, each micro-cell is hexagonal, and each gate electrode consists of 3 gate electrodes. This is shown in further detail in FIG. 3. The top row of the figure includes a plan view and an overhead photographic view of a hexagonal micro-cell 60 with three gate electrodes (62a, 62b, 62c) and a drain electrode 64, surrounding a hexagonal central source electrode 66. The bottom row depicts views of a hexagonal micro-cell 70 with two gate electrodes (72a, 72b) and a source electrode 74, surrounding a hexagonal central drain electrode 76. The regions 68 around the central electrode 66/76 where there are gate electrodes conduct the micro-cell's current, while the regions 69 where there are no gate electrodes are electrically isolated; i.e., current flow between the source and drain electrodes only occurs under the gate electrodes. Thus, rather than trying to maximize current flow per unit area as in prior art devices, here the number of gate electrodes in a micro-cell can be selected to define a current conducting area designed to, for example, minimize peak junction temperature for a desired power density. These are only examples; micro-cell perimeter shapes, center electrode shapes, and the number and width of the gate electrodes can be varied as needed for a particular application.

FIG. 4a depicts a micro-cell without a gate electrode-interconnecting metal layer, with three gate electrodes 80 around a hexagonal central drain electrode 82 (which is connected to using a first metal layer, labeled M1). In FIG. 4b, a second metal layer 84 (labeled M2) is shown, which interconnects the gate electrodes of a given micro-cell, as well as the gate electrodes of adjacent micro-cells. Metal layer 84 is preferably a substantially continuous sheet of metal, except for via openings which enable connection to the source and/or drain electrodes below the gate metal.

Figure 4C:
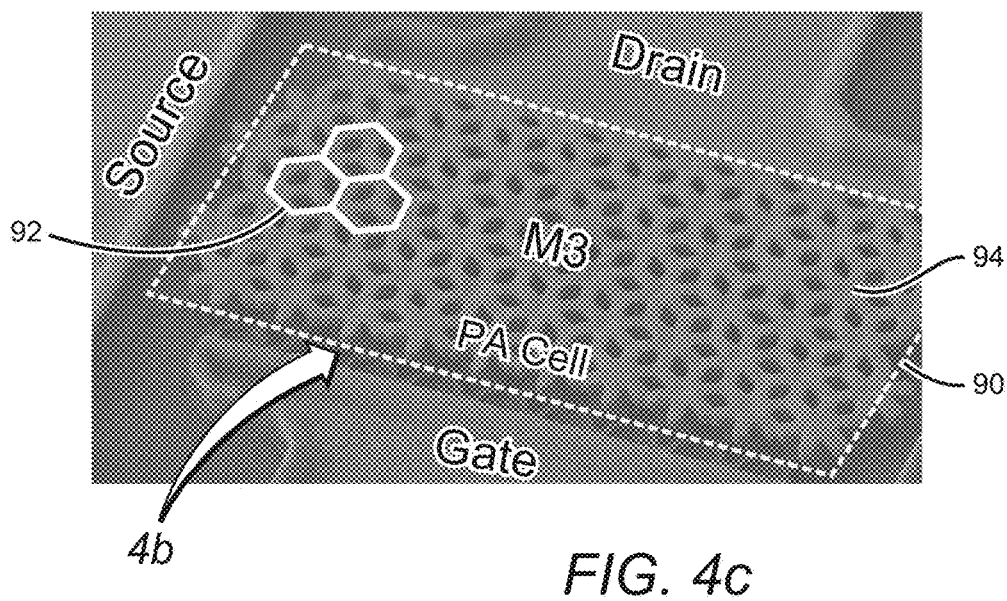
FIG. 4c is a photograph illustrating the use of the present micro-cells to form a power amplifier (PA) unit cell.

One exemplary application of a FET in accordance with the present invention is a power amplifier (PA), as might be used in a PA monolithic microwave integrated circuit (PA MMIC), for example. Such an amplifier may be assembled by interconnecting a plurality of PA "unit cells", and each unit cell may be assembled by interconnecting a plurality of micro-cells as described herein. This is illustrated in FIG. 4c, in which numerous micro-cells such as those shown in FIGS. 4a and 4b are interconnected to form a PA cell 90. The outlines 92 of three such micro-cells are indicated in FIG. 4c, though the micro-cells themselves are hidden from view by the presence of third metal layer 94 (labeled M3).

Numerous advantages are realized with the micro-scale device structure described herein, in which many micro-cells are uniformly distributed over an entire active device area and connected using a (preferably) low-parasitic multi-layer interconnect arrangement. This unique FET structure enables uniform distribution of heat generated under high power operation. This greatly (1) reduces peak junction temperature for a given output power density (watts per unit area), or (2) increases output power density for a given peak junction temperature. A reduced peak junction temperature tends to improve a FET's reliability and extend its lifetime as well as the FET's gain, output power, efficiency and linearity performance.

Connecting the gate electrodes from the top using a substantially large sheet of metal reduces gate resistance as compared to conventional multi-finger gate devices where an input signal is fed through the long gates from one end. Reduced gate resistance serves to increase power gain and reduce a noise figure for the FET. For the present structure, a device unit cell size at given frequencies can be maximized due to reduced constraints on gate resistance and phase-delay. This enables a reduction in the number of unit cells, and therefore the number of cells that need to be combined to form a power amplifier IC, thereby improving the IC's efficiency.

In one possible embodiment, the device substrate comprises GaN having a hexagonal epitaxial crystal, with the at least one gate electrode aligned parallel to the m-planes or a-planes of the hexagonal epitaxial crystal. In other possible embodiments, such as with a GaAs or InP substrate, the crystal structure is square; here, the source or drain electrode at the center of the micro-cell, and the perimeter of the micro-cell, are preferably also square.

Micro-cells can have any desired diameter; a preferred diameter is 10 µm or less. The number and width of the gate electrodes in each micro-cell may be selected to achieve a desired power density (W/mm) and/or heat distribution profile for the FET, and/or to minimize junction temperature.

The FET may include a channel layer. In one possible embodiment, each of the gate electrodes comprises a buried gate structure, the top of which extends above the substrate's top surface and the bottom of which is buried to a depth at least equal to that of the bottom of the channel layer, such that the buried gate structures contact the channel layer only from the sides. Note that as used herein, the substrate's "top surface" refers to the surface of the uppermost epitaxial layer that has been grown on the substrate. For this embodiment, each gate electrode also comprises a head portion which is preferably above and not in contact with the substrate's top surface. This arrangement is illustrated in FIG. 1, which includes a channel layer 100. As shown there, gate electrodes 20a and 20b each include a buried portion 102a, 102b, each of which is buried to a depth at least equal to that of the bottom of channel layer 100. Gate electrodes 20a and 20b also include head portions 104a, 104b which are above and not in contact with the top surface of substrate 12. In this way, buried gate structures 102a and 102b contact channel layer 100 only from the sides. Second metal layer 28 then interconnects the gate electrodes by contacting the tops of head portions 104a and 104b. Note that the gap between the top surface of substrate 12 and the gate head portions may be simply a void, or may be filled with a dielectric such as SiN, $SiO_2$, and BCB. If a dielectric is used, it should be thick enough so that the head portion does not modulate the transistor current via the vertical gate field (through the dielectric).

The present micro-scale device structure may be applied to a variety of FET types. For example, a FET in accordance with the present invention could be a high electron mobility transistor (HEMT), in which case the channel layer comprises two-dimensional electron gas (2DEG). Such a FET would typically comprise an epitaxial buffer layer below the channel layer and an epitaxial top barrier layer above the channel layer. If buried gate structures as described above are employed, the bottoms of the buried gate structures are preferably buried into the buffer layer.

HEMTs that might employ the device structure described herein might be formed from various combinations of substrates and epitaxial layer materials. As noted above, a HEMT typically includes buffer, channel, and top barrier layers. Several possible material combinations are listed below; other combinations may also be possible.

1. AlGaN top barrier/GaN channel/GaN or AlGaN buffer on SiC, Si, GaN, AlN, sapphire, or diamond substrate
2. AlGaAs top barrier/InGaAs channel/GaAs or AlGaAs buffer on GaAs substrate
3. InAlAs top barrier/InGaAs channel/InP or InAlAs buffer on InP substrate
4. $(AlGa)_2O_3$ top barrier/$Ga_2O_3$ channel/$Ga_2O_3$ buffer on $Ga_2O_3$ substrate The present device structure might also be a metal semiconductor field-effect transistor (MESFET), which would typically include an epitaxial buffer layer on the substrate and an epitaxial channel layer on the buffer layer. Such a MESFET might comprise, for example, a SiC substrate, a GaN buffer layer, and a Si-doped GaN channel layer on the buffer layer.

MESFETs that might employ the device structure described herein might be formed from various combinations of substrates and epitaxial layer materials. Several possible material combinations are listed below; other combinations may also be possible.

1. N-type GaN channel/GaN or AlGaN buffer on SiC, Si, GaN, AlN, sapphire, or diamond substrate
2. N-type GaAs channel/GaAs or AlGaN buffer on GaAs substrate
3. N-type InGaAs channel/InP or InAlAs buffer on InP substrate
4. N-type $Ga_2O_3$ channel/$Ga_2O_3$ buffer on $Ga_2O_3$ substrate As noted above, the present micro-scale device structure is well-suited to use with a FET power amplifier (PA). This application would typically include a substrate having an epitaxial active channel area. A plurality of interconnected micro-cells as described herein are preferably uniformly distributed over the active channel area and interconnected to form a PA unit cell, and a plurality of PA unit cells are interconnected to form a power amplifier.

Figure 5A:
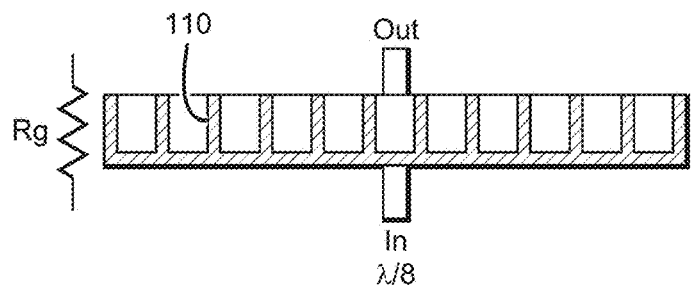
FIG. 5a is a plan view illustrating unit cell size limitations for a conventional multi-finger HEMT.

The present micro-scale device structure also enables an increased unit cell size. FIG. 5a depicts a conventional HEMT with multiple gate fingers 110. Here, maximum device size in the Y-direction is limited by gate resistance (Rg). Gate-to-gate pitch is optimized for the best trade-off between Tj vs. maximum output power (Pout). For example, the maximum MMIC unit cell size @40 Ghz: $\lambda/8=0.4$ mm, total area size=0.03 $mm^2$.

Figure 5B:
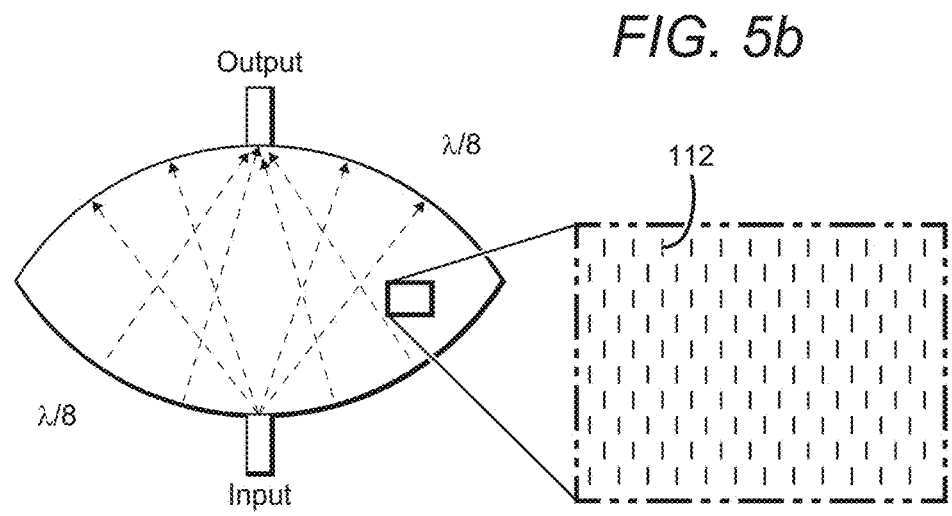
FIG. 5b is a plan view illustrating unit cell size limitations for a HEMT in accordance with the present invention.

FIG. 5b depicts how area size is improved when using the micro-scale device structure described herein. As noted above, the gate electrodes 112 are contacted at the top of each electrode. As a result, the Rg constraint is reduced or eliminated, and MMIC unit area size limited by $\lambda/8$ is maximized. For example, the maximum MMIC unit cell size @40 Ghz: $\lambda/8=0.4$ mm, total area size=0.2 $mm^2$. As such, fewer unit cells need to be combined to achieve a desired Pout. In general, when more unit cells are combined to construct a PA MMIC, the combining circuit elements add unwanted loss, resulting in degraded power added efficiency (PAE). For the present structure, where the number of combined unit cells is reduced, the degradation of the PAE due to the combining loss is greatly suppressed.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A field-effect transistor (FET), comprising:
    a substrate comprising a crystal structure on which an epitaxial active channel area has been grown;
    a plurality of micro-cells uniformly distributed over said active channel area, each of said micro-cells comprising:
        a source electrode;
        a drain electrode; and
        at least one gate electrode;
        wherein one of said source or drain electrodes is at the center of said micro-cell and the other of said source or drain electrodes is along the perimeter of said micro-cell, said at least one gate electrode aligned parallel to one of the crystal planes of said substrate comprising a crystal structure;
        said micro-cell arranged such that there are not gate electrodes aligned parallel to at least some of said crystal planes such that at least some of the regions around the electrode at the center of said micro-cell are electrically isolated; and
    a multi-layer interconnection arrangement, wherein a first metal layer interconnects one of said drain or source electrodes, a second metal layer interconnects said gate electrodes, and a third metal layer interconnects the other of said drain or source electrodes.

2. The FET of claim 1, wherein said second and third metal layers comprise air-bridge interconnection layers.

3. The FET of claim 1, further comprising dielectric layers between said first and second metal layers and between said second and third metal layers.

4. The FET of claim 3, wherein said dielectric layers comprise BCB, $SiO_2$, SiN or SiCN.

5. The FET of claim 1, wherein said metal layer interconnecting said gate electrodes is a substantially continuous sheet of metal, except for via openings which enable connection to the source and/or drain electrodes below said metal layer interconnecting said gate electrodes.

6. The FET of claim 1, further comprising vias which provide conductive paths between said third metal layer and said drain or source electrodes.

7. The FET of claim 1, wherein in each micro-cell, one of said source or drain electrodes is at the center of said micro-cell and the other of said source or drain electrodes surrounds said center electrode.

8. The FET of claim 1, wherein each of said micro-cells has x sides, said at least one gate electrode consisting of 1 to x gate electrodes.

9. The FET of claim 1, said micro-cell arranged such that said electrode at the center of said micro-cell, and the perimeter of said micro-cell, are hexagonal.

10. The FET of claim 9, wherein said substrate comprises GaN having a hexagonal epitaxial crystal, said at least one gate electrode aligned parallel to the en-planes or a-planes of said hexagonal epitaxial crystal.

11. The FET of claim 1, said micro-cell arranged such that the electrode at the center of said micro-cell, and the perimeter of said micro-cell, are square.

12. The FET of claim 11, wherein said substrate comprises GaAs or InP.

13. The FET of claim 1, wherein each of said micro-cells has a diameter of 10 μm or less.

14. The FET of claim 1, wherein the number and width of gate electrodes in each of said micro-cells is selected to achieve a desired power density (W/mm) for said FET.

15. The FET of claim 1, wherein said interconnected micro-cells form a unit cell for a power amplifier.

16. The FET of claim 1, further comprising a channel layer on said substrate, wherein each of said gate electrodes comprises:
- a buried gate structure, the top of which extends above said substrate's top surface and the bottom of which is buried to a depth at least equal to that of the bottom of said channel layer, such that said buried gate structure contacts said channel layer only from the sides of said channel layer; and
- a head portion above and not in contact with said substrate's top surface;
- said second metal layer contacting the tops of said head portions.

17. The FET of claim 16, further comprising a dielectric between said substrate's top surface and said head portion.

18. The FET of claim 1, further comprising a channel layer on said substrate, wherein said FET is a high electron mobility transistor (HEMT) and said channel layer comprises two-dimensional electron gas (2DEG).

19. The FET of claim 18, further comprising an epitaxial buffer layer below said channel layer and an epitaxial top barrier layer above said channel layer, the bottoms of said buried gate structures buried into said buffer layer.

20. The FET of claim 1, wherein said FET is a metal semiconductor field-effect transistor (MESFET), said MESFET comprising:
- an epitaxial buffer layer on said substrate; and
- an epitaxial channel layer on said buffer layer.

21. A FET power amplifier (PA), comprising:
- a substrate comprising a crystal structure on which an epitaxial active channel area has been grown;
- a plurality of interconnected PA unit cells, each of said PA unit cells comprising:
  - a plurality of interconnected micro-cells uniformly distributed over said active channel area, each of said micro-cells comprising:
    - a source electrode;
    - a drain electrode; and
    - at least one gate electrode;
    - wherein one of said source or drain electrodes is at the center of said micro-cell and the other of said source or drain electrodes is along the perimeter of said micro-cell, said at least one gate electrode aligned parallel to one of the crystal planes of said substrate comprising a crystal structure;
    - said micro-cell arranged such that there are not gate electrodes aligned parallel to at least some of said crystal planes such that at least some of the regions around the electrode at the center of said micro-cell are electrically isolated; and
  - a multi-layer interconnection arrangement, wherein a first metal layer interconnects one of said drain or source electrodes, a second metal layer interconnects said gate electrodes, and a third metal layer interconnects the other of said drain or source electrodes.

22. The FET of claim 21, wherein the number and width of said gate electrodes in each of said micro-cells is selected to achieve a desired power density (W/mm) for said FET.

23. The FET of claim 21, wherein the number and width of said gate electrodes in each of said micro-cells is selected to achieve a desired heat distribution profile for said FET.

24. The FET of claim 23, wherein the number and width of said gate electrodes in each of said micro-cells is selected to minimize junction temperature for said FET.

25. The FET of claim 21, further comprising a channel layer on said substrate, wherein each of said gate electrodes comprises:
- a buried gate structure, the top of which extends above said substrate's top surface and the bottom of which is buried to a depth at least equal to that of the bottom of said channel layer, such that said buried gate structure contacts said channel layer only from the sides of said channel layer; and
- a head portion above and not in contact with the top surface of said micro-cells;
- said second metal layer contacting the tops of said head portions.

26. The FET of claim 25, further comprising a dielectric between said substrate's top surface and said head portion.

* * * * *

UNITED STATES PATENT AND TRADEMARK OFFICE
CERTIFICATE OF CORRECTION

PATENT NO. : 10,249,711 B2
APPLICATION NO. : 15/638041
DATED : April 2, 2019
INVENTOR(S) : Keisuke Shinohara et al.

Page 1 of 1

It is certified that error appears in the above-identified patent and that said Letters Patent is hereby corrected as shown below:

In the Specification

Column 1 Line 3 After TITLE, add:
GOVERNMENT RIGHTS
This invention was made with Government support under FA8650-13-C-7313 awarded by Air Force Research Laboratory – WPAFB. The Government has certain rights in the invention.

Signed and Sealed this
Third Day of September, 2019

Andrei Iancu
*Director of the United States Patent and Trademark Office*